United States Patent
Chuang et al.

(10) Patent No.: US 9,853,125 B2
(45) Date of Patent: Dec. 26, 2017

(54) VERTICAL TUNNELING FIELD-EFFECT TRANSISTOR CELL AND FABRICATING THE SAME

(71) Applicant: Taiwan Semiconductor Manufacturing Company, Ltd., Hsin-Chu (TW)

(72) Inventors: Harry-Hak-Lay Chuang, Singapore (SG); Cheng-Cheng Kuo, Hsinchu (TW); Chi-Wen Liu, Hsinchu (TW); Ming Zhu, Singapore (SG)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/937,445

(22) Filed: Nov. 10, 2015

(65) Prior Publication Data

US 2016/0064524 A1 Mar. 3, 2016

Related U.S. Application Data

(62) Division of application No. 13/745,459, filed on Jan. 18, 2013, now Pat. No. 9,190,484.

(51) Int. Cl.
*H01L 29/66* (2006.01)
*H01L 21/33* (2006.01)
(Continued)

(52) U.S. Cl.
CPC .... *H01L 29/66666* (2013.01); *H01L 29/0676* (2013.01); *H01L 29/41775* (2013.01); *H01L 29/66356* (2013.01); *H01L 29/7391* (2013.01)

(58) Field of Classification Search
CPC ........... H01L 29/7827; H01L 29/66666; H01L 29/0676; H01L 29/7391; H01L 29/66356; H01L 29/78642
(Continued)

(56) References Cited

U.S. PATENT DOCUMENTS

| 8,080,458 B2 | 12/2011 | Masuoka et al. |
| 8,901,640 B2 | 12/2014 | Masuoka et al. |

(Continued)

FOREIGN PATENT DOCUMENTS

| KR | 2010-0115711 | 10/2010 |
| KR | 2011-0053201 | 5/2011 |
| KR | 2012-0066150 | 6/2012 |

OTHER PUBLICATIONS

Korean Intellectual Property Office, Korean Notice of Allowance dated Mar. 7, 2016, for Application No. 10-2013-0042755, 3 pages.
(Continued)

*Primary Examiner* — Fernando L Toledo
*Assistant Examiner* — Aaron Gray
(74) *Attorney, Agent, or Firm* — Haynes and Boone, LLP

(57) ABSTRACT

A tunneling field-effect transistor (TFET) device is disclosed. A frustoconical protrusion structure is disposed over the substrate and protrudes out of the plane of substrate. A drain region is disposed over the substrate adjacent to the frustoconical protrusion structure and extends to a bottom portion of the frustoconical protrusion structure as a raised drain region. A gate stack is disposed over the substrate. The gate stack has a planar portion, which is parallel to the surface of substrate and a gating surface, which wraps around a middle portion of the frustoconical protrusion structure, including overlapping with the raised drain region. An isolation dielectric layer is disposed between the planar portion of the gate stack and the drain region. A source region is disposed as a top portion of the frustoconical protrusion structure, including overlapping with a top portion of the gating surface of the gate stack.

20 Claims, 6 Drawing Sheets

(51) Int. Cl.
    *H01L 21/336* (2006.01)
    *H01L 29/739* (2006.01)
    *H01L 29/06* (2006.01)
    *H01L 29/417* (2006.01)

(58) Field of Classification Search
    USPC ....... 257/329, 24, 25, E21.41; 438/268, 212, 438/138, 156
    See application file for complete search history.

(56) References Cited

U.S. PATENT DOCUMENTS

| | | | |
|---|---|---|---|
| 9,153,697 | B2 | 10/2015 | Masuoka et al. |
| 9,168,490 | B2 | 10/2015 | Majumdar et al. |
| 2007/0052012 | A1* | 3/2007 | Forbes .................. B82Y 10/00 257/328 |
| 2011/0115011 | A1* | 5/2011 | Masuoka ........ H01L 21/823431 257/314 |
| 2011/0303973 | A1* | 12/2011 | Masuoka .......... H01L 21/26586 257/329 |
| 2013/0095625 | A1* | 4/2013 | Masuoka .......... H01L 21/76804 438/268 |
| 2014/0042524 | A1* | 2/2014 | Chuang ............. H01L 21/28114 257/329 |
| 2014/0203350 | A1 | 7/2014 | Chuang et al. |

OTHER PUBLICATIONS

Korean Intellectual Property Office, Summary of Reference Material dated Mar. 8, 2016, 1 page.

\* cited by examiner

VERTICAL TUNNELING FIELD-EFFECT TRANSISTOR CELL AND FABRICATING THE SAME

PRIORITY DATA

The present application is a divisional application of U.S. patent application Ser. No. 13/745,459, filed Jan. 18, 2013, which is incorporated herein by reference in its entirety.

CROSS-REFERENCE

This patent is related to U.S. Ser. No. 13/745,225, filed Jan. 18, 2103, now U.S. Pat. No. 8,754,470, entitled "A Vertical Tunneling Field-Effect Transistor Cell And Fabricating The Same," which is hereby incorporated by reference in its entirety.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

However, as the size of the smallest component has decreased, numerous challenges have risen. As features become closer, current leakage can become more noticeable, signals can crossover more easily, and power usage has become a significant concern. The semiconductor integrated circuit industry has produced numerous developments in effort to continue the process of scaling. One of the developments is the potential replacement or supplementation of the conventional MOS field-effect transistor by the tunneling field-effect transistor (TFET).

Tunneling FETs are promising devices that may enable further scaling of power supply voltage without substantially increasing off-state leakage currents due to its sub-60 mV/dec subthreshold swing. However, existing TFETs have not been satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
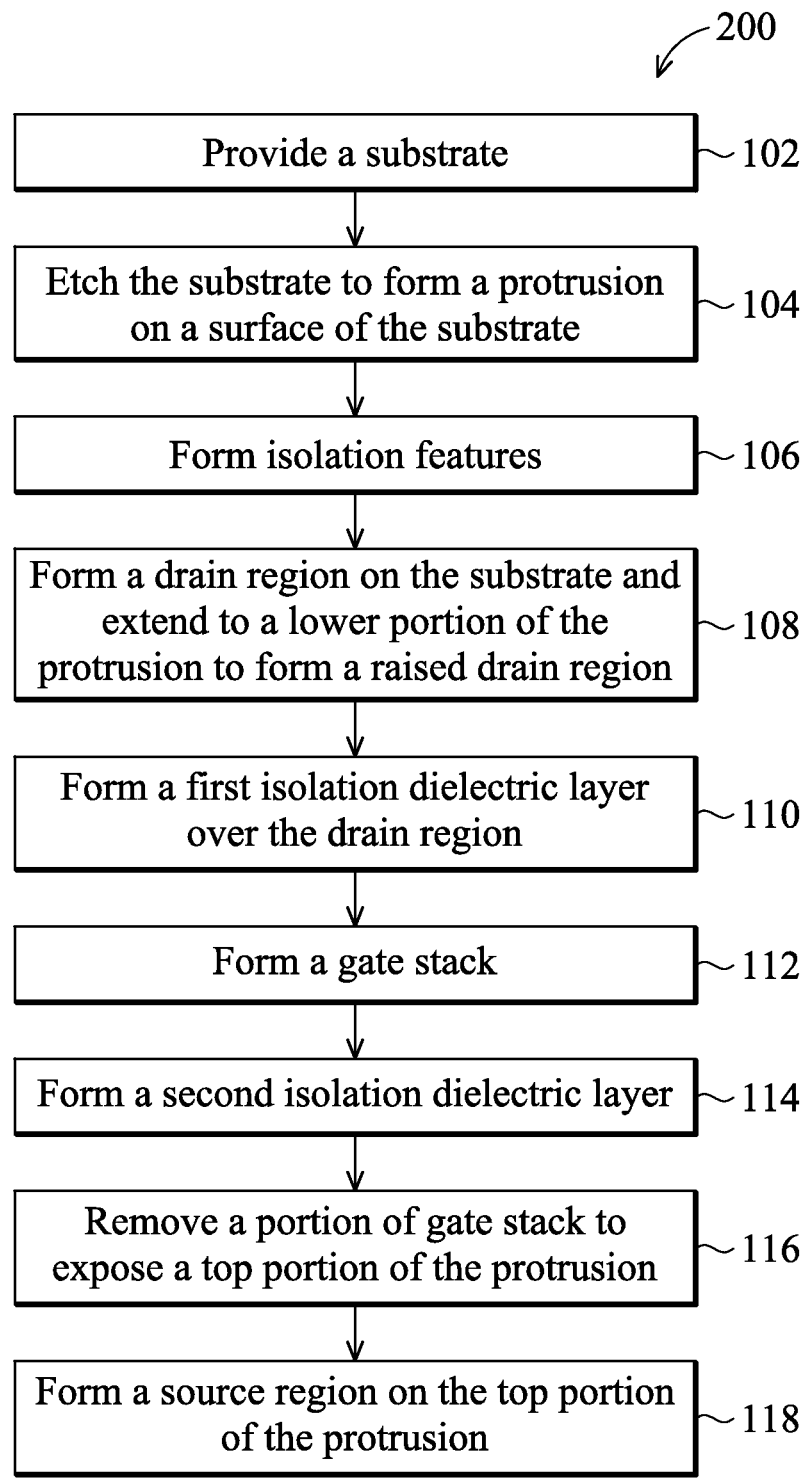
FIG. 1 is a flowchart of an example method for fabricating a semiconductor device constructed according to various aspects of the present disclosure.

FIG. 1 is a flowchart of one embodiment of a method 100 of fabricating one or more TFET devices according to aspects of the present disclosure. The method 100 is discussed in detail below, with reference to a TFET device 200 shown in FIGS. 2A to 9 for the sake of example.

The method 100 begins at step 102 by providing a substrate 210. The substrate 210 includes silicon. In alternative embodiments, the substrate 210 may include germanium, silicon germanium, gallium arsenide, silicon carbide, indium arsenide, indium phosphide, gallium arsenic phosphide, gallium indium, or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials. The substrate 210 may also include various p-type doped regions and/or n-type doped regions, implemented by a process such as ion implantation and/or diffusion. Those doped regions include n-well and p-well.

Figure 2A:
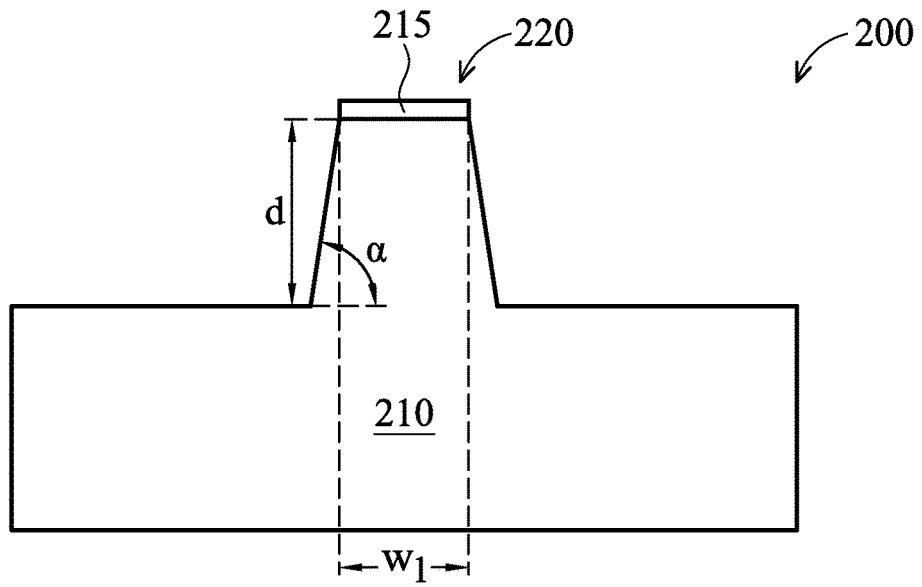
FIGS. 2A, 3 to 9 are cross-sectional views of an example semiconductor device at fabrication stages constructed according to the method of FIG. 1.

Referring to FIGS. 1 and 2A, the method 100 proceeds to step 104 by etching the substrate 210 to form a frustoconical protrusion structure 220, which protrudes out of the plane of substrate 210. The frustoconical protrusion structure 220 is referred as a core structure 220. The core structure 220 may be formed by lithography and etching processes. In one embodiment, a hard mask layer 215 is deposited on the substrate 210 first. The hard mask 215 includes silicon oxide, silicon nitride, silicon oxynitride, or any other suitable dielectric material. The hard mask 215 may be patterned by lithography and etching processes to define the core structure 220 with a first width $w_1$. The substrate 210 is etched by using the patterned hard mask 215 as an etching mask to form the core structure 220. The etch process may include wet etch, dry etch, or a combination thereof. The core structure 220 can be formed with sidewalls having an angle α with the planar surface of the substrate 210 ranging from approximately 45 degrees to around 90 degrees.

Figure 2B:
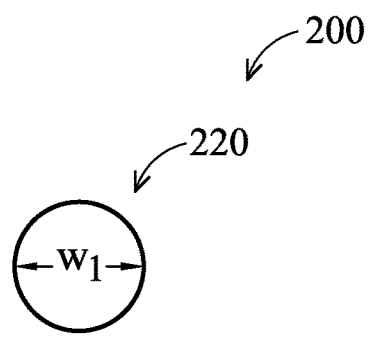
FIG. 2B is a top, schematic view of a portion of the semiconductor device of FIG. 2A.

In one embodiment, the core structure 220 is formed as a cylinder shape. A top view of the cylinder core structure 220 is shown in FIG. 2B. The first width $w_1$ is in a range from 5 nm to 50 nm. Alternatively, the core structure 220 is formed as square-column, oval cylinder, rectangular column, hexagonal column, or other polygon-column shape.

Figure 3:
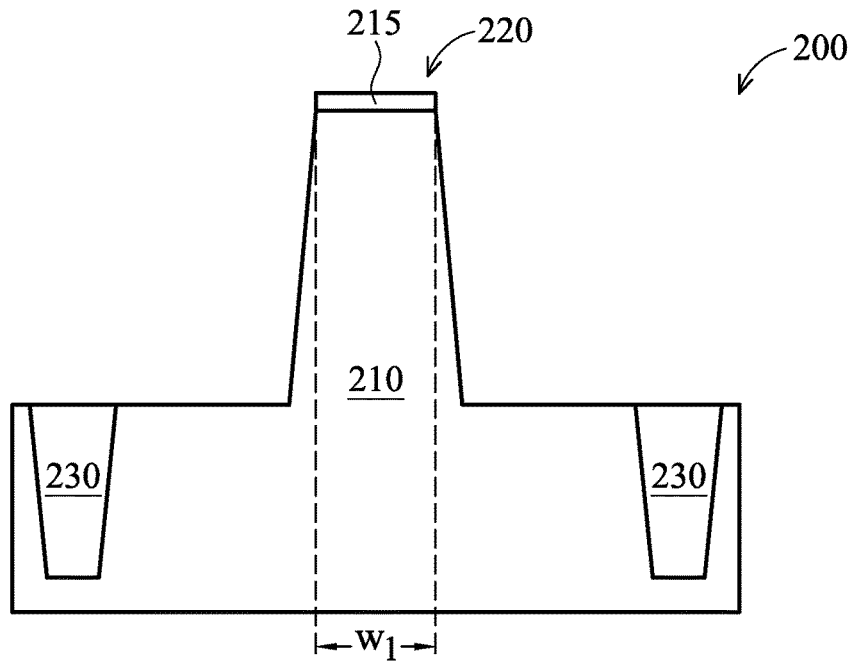

Referring to FIGS. 1 and 3, the method 100 proceeds to step 106 by forming isolation features 230 on the substrate 210, including between each core structure 220. The isolation features 230 include different structures formed by using different processing technologies. In one embodiment, the isolation features 230 are shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench.

Figure 4:
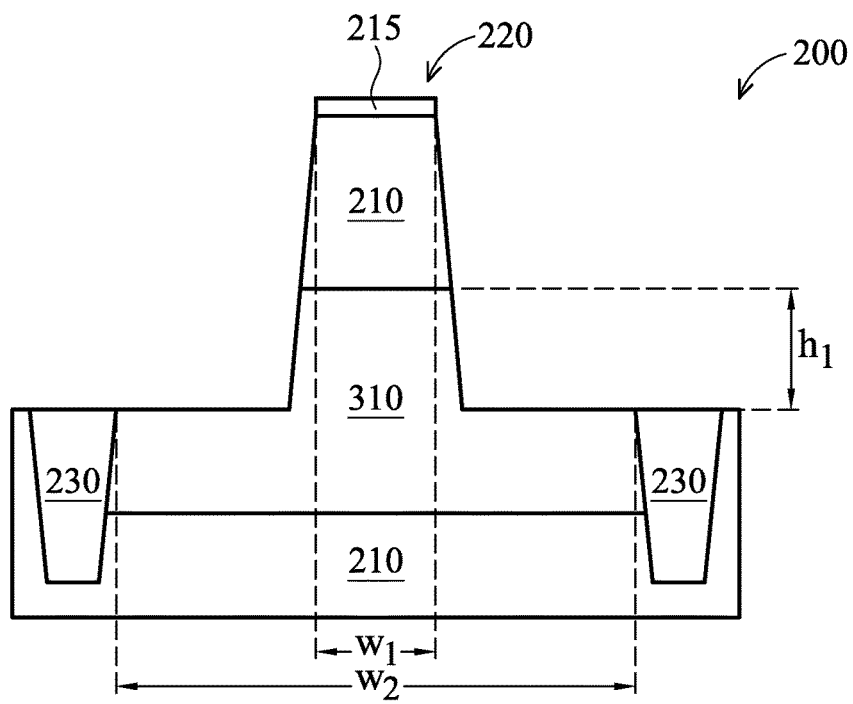

Referring to FIGS. 1 and 4, the method 100 proceeds to step 108 by forming a drain region 310 with a second width $w_2$ on the substrate 210. The second width $w_2$ is substantially larger than the first width $w_1$. In one embodiment, the drain region 310 is concentric with the core structure 220. The drain region 310 is formed by doping a predetermined top portion of the substrate 210 by a suitable technique, such as implantation with a patterned photo resist as an implantation mask. In the present embodiment, the drain region 310 is adjacent to the core structure 220. For a p-type TFET, the drain region 310 may be doped with p-type dopants, such as boron or $BF_2$. For an n-type TFET, the drain region 310 may be doped with n-type dopants, such as phosphorus, arsenic, or combinations thereof. After the implantation, one or more annealing processes may be performed for dopant activation. The annealing processes may include rapid thermal anneal (RTA), laser anneal, or other suitable annealing process. As an example, high-temperature anneal includes a "spike" annealing process that has a very short time duration. During the formation, the dopant is diffused up to a bottom portion of the core structure 220 with a first height of $h_1$, referred as to a raised drain region 310.

Figure 5:
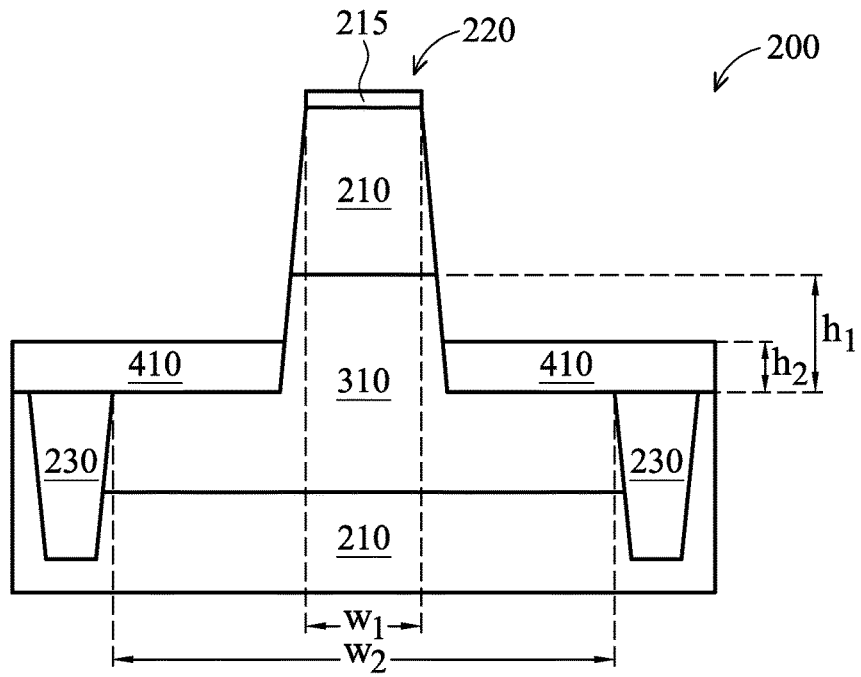

Referring to FIGS. 1 and 5, the method 100 proceeds to step 110 by forming a first isolation dielectric layer 410 over the drain region 310 by deposition and recess processes. The first isolation dielectric layer 410 includes silicon oxide, silicon nitride, silicon carbide, oxynitride or other suitable materials. The isolation dielectric layer 410 includes a single layer or multiple layers. The first isolation dielectric layer 410 is deposited by a suitable technique, such as chemical vapor deposition (CVD), atomic layer deposition (ALD), physical vapor deposition (PVD), thermal oxidation, or combinations thereof. In the present embodiment, the isolation dielectric layer 410 is etched back to a second height $h_2$, which is substantial less than the first height $h_1$ of the raised drain region 310. The first isolation dielectric layer 410 may be recessed by a selective dry etch, a selective wet etch, or combinations thereof.

Figure 6:
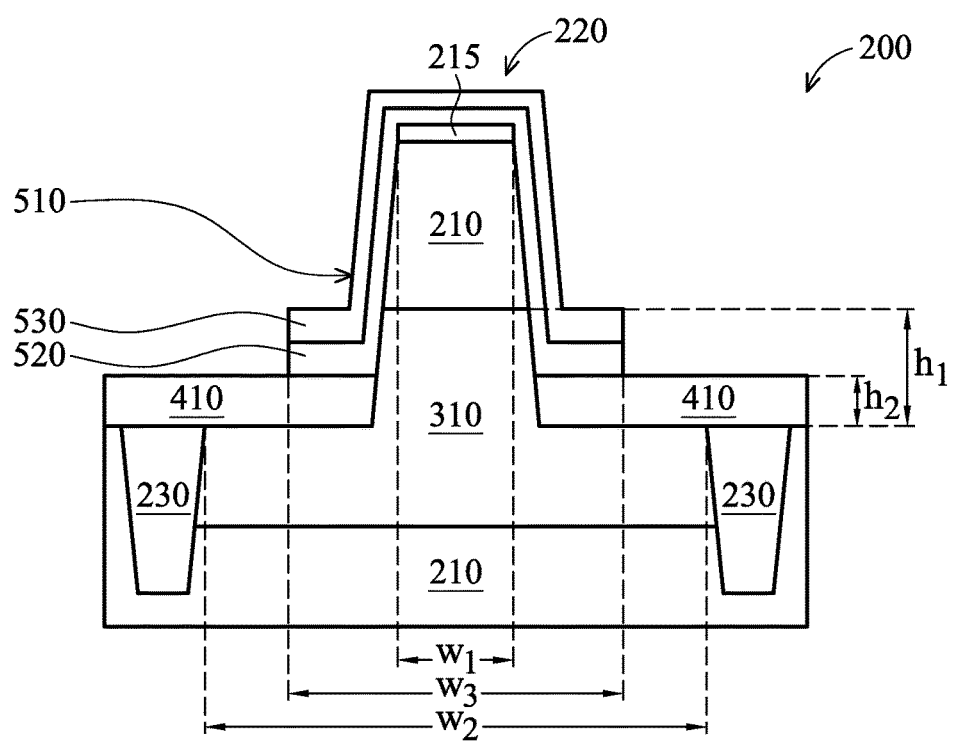

Referring to FIGS. 1 and 6, the method 100 proceeds to step 112 by forming a gate stack 510. The gate stack 510 includes a planar portion, which is parallel to the surface of substrate 210 and over the first isolation dielectric layer 410, and a gating surface, which wraps around a middle portion of the core structure 220. A total width of the gate stack 510, a third width $w_3$, is substantially larger than the first width $w_1$ of the core structure 220 and less than the second width $w_2$ of the drain region 310. In one embodiment, the out-of-plane gating surface of gate stack 510 overlaps a portion of the raised drain region 310.

The gate stack 510 is formed by any suitable process or processes. For example, the gate stack 510 is formed by a procedure including depositing, photolithography patterning, and etching processes. The deposition processes include CVD, PVD, ALD, metalorganic CVD (MOCVD), other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching process includes a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. The etching process may include a multiple-step etching to gain etch selectivity, flexibility and desired etch profile.

Referring also to FIG. 6, in one embodiment, the gate stack 510 is a high-k (HK)/metal gate (MG). The HK/MG includes a gate dielectric layer 520 and a MG 530. The gate dielectric layer 520 may include an interfacial layer (IL) and a high-k (HK) dielectric layer. The IL includes oxide, HfSiO and oxynitride. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The MG 530 may include a single layer or multi layers, such as a metal layer, a liner layer, a wetting layer, and an adhesion layer. The MG 530 may include Ti, Ag, Al, TiAlN, TaC, TaCN, TaSiN, Mn, Zr, TiN, TaN, Ru, Mo, Al, WN, Cu, W, or any suitable materials.

In another embodiment, the gate stack 510 is a polysilicon gate stack. The polisilicon gate stack may include a gate dielectric layer and a polysilicon layer deposited over the gate dielectric layer. The gate dielectric layer includes silicon oxide, silicon nitride, or any other suitable materials.

Figure 7:
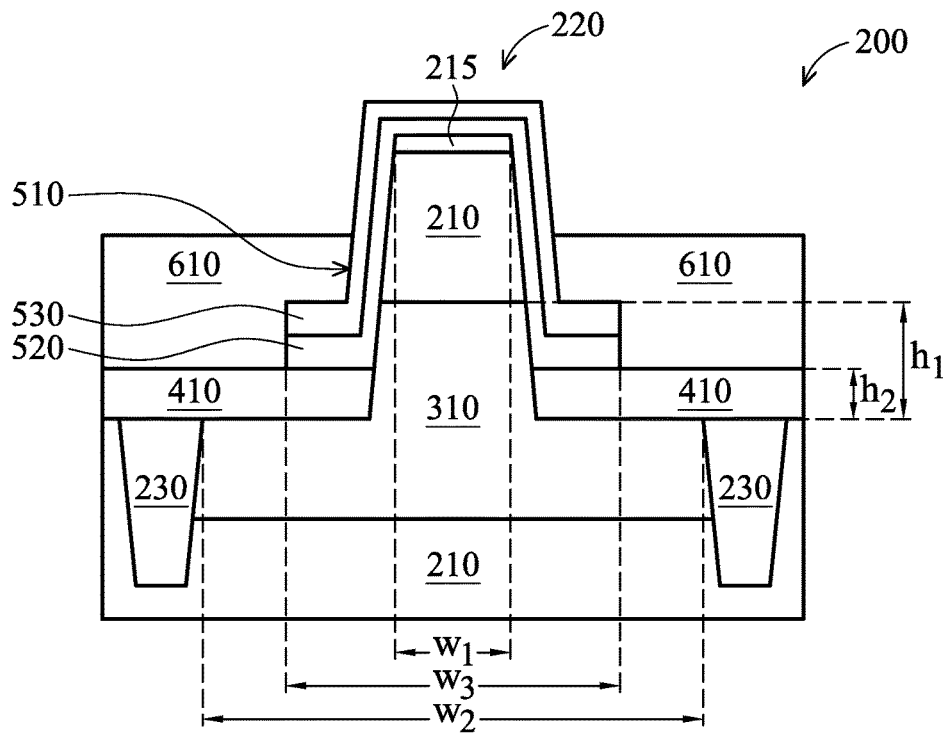

Referring to FIGS. 1 and 7, the method 100 proceeds to step 114 by forming a second isolation dielectric layer 610 over the first isolation dielectric layer 410, including over the planar portion of the gate stack 510. The second isolation dielectric layer 610 is similar in many respects to those discussed above in association with the first isolation dielectric layer 410 in FIG. 5. The second isolation dielectric layer 610 is etched back to expose a predetermined height of a top portion of the gating surface of gate stack 510. In one embodiment, the predetermined height is substantially larger than a thickness of the hard mask layer 215.

Figure 8:
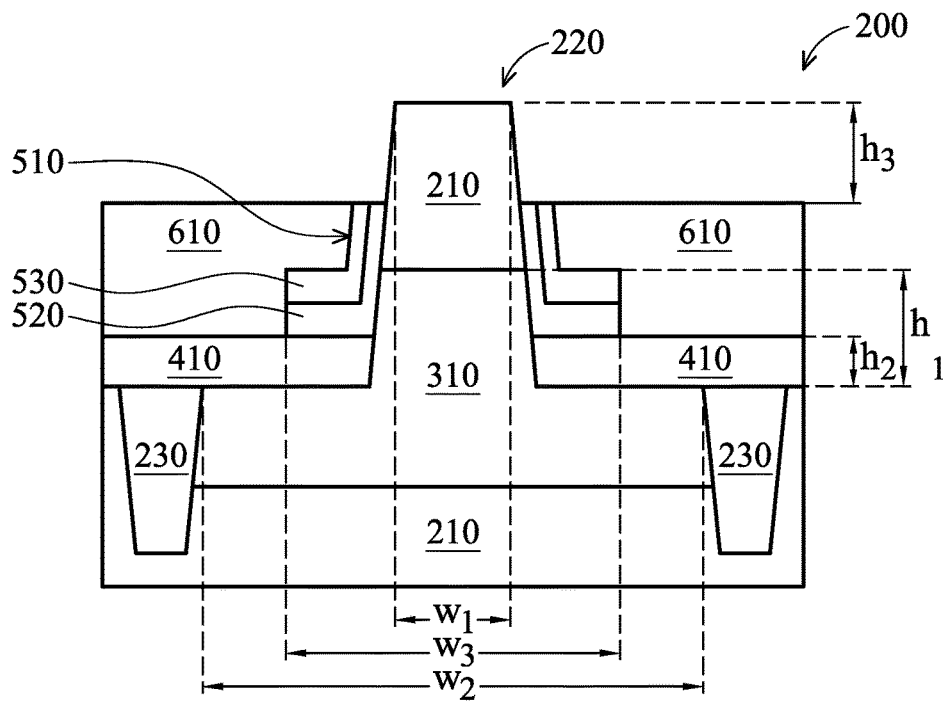

Referring to FIGS. 1 and 8, the method 100 proceeds to step 116 by removing a top portion of the gating surface of the gate stack 510 to expose a top portion of the core structure 220 with a third height $h_3$. The top portion of the gating surface of the gate stack 510 may be removed by a selective dry etch, a selective wet etch, a combination thereof, or other suitable processes. The hard mask layer 215 is also removed at the same etch process or at an extra etch process. In one embodiment, the gating surface of the gate stack 510 above the second isolation dielectric layer 610 is removed.

Figure 9:
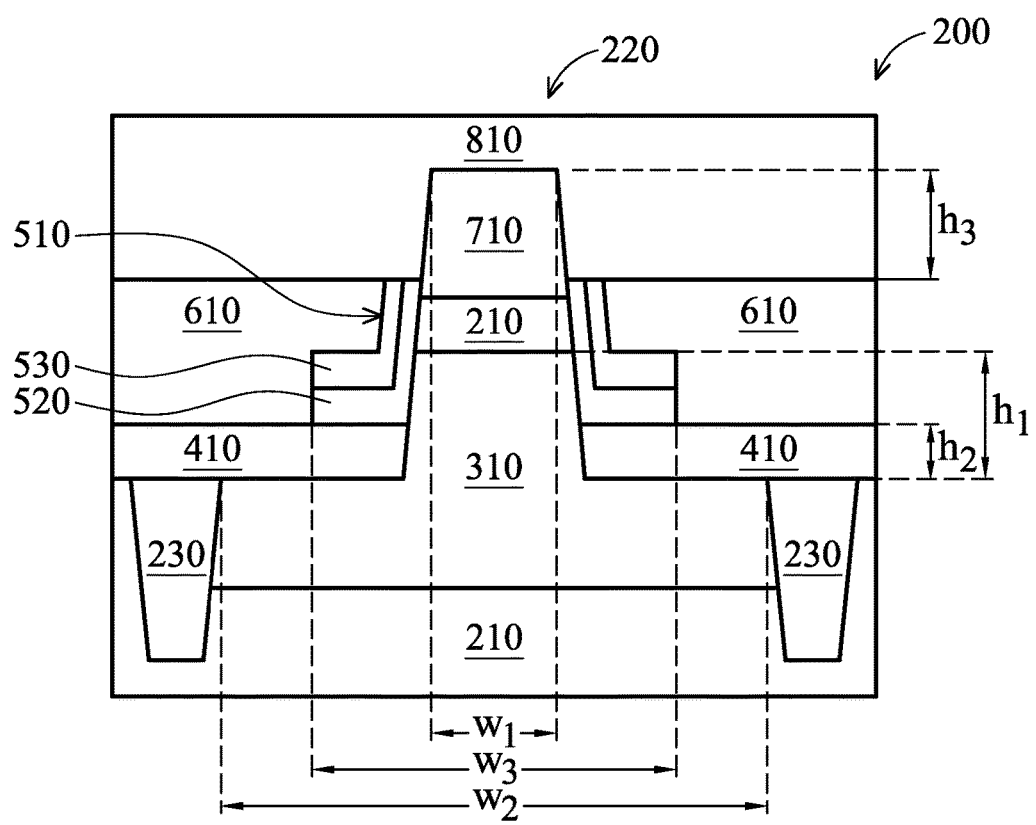

Referring to FIGS. 1 and 9, the method 100 proceeds to step 118 by forming a source region 710 in the top portion of the core structure 220. The source region 710 may be designed to have a polygon shape which is different than the shape of the middle portion of the core structure 220. For example, the source region 710 is designed to have a H-shape as its cross-section.

In one embodiment, the source region 710 is formed by photolithography patterning and implantation, which is similar in many respects to those discussed above in association with the drain region 310 in FIG. 4. The source region 710 has a different dope type than the drain region 310. In another embodiment, the core structure 220 is recessed first and then the source region 710 is formed as the top portion of the recessed core structure 220 by photolithography patterning and implantation. In yet another embodiment, a semiconductor material is epitaxially grown on the recessed core structure 220. The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. The S/D features may be formed by one or more epitaxy or epitaxial (epi) processes. The source region 710 may be in-situ doped during the epitaxy process. In one embodiment, the source region 710 is not in-situ doped, an implantation process (i.e., a junction implant process) is performed to dope the source region 710.

A third isolation dielectric layer 810 is deposited over the second isolation dielectric layer 610, including over the source region 710. The third isolation dielectric layer 810 is similar in many respects to those discussed above in association with the first isolation dielectric layer 410 in FIG. 3. Additionally, a CMP process is performed to planarize the top surface of the third isolation dielectric layer 810.

The TFET device 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features or structures of the TFET device 200. For example, a multilayer interconnection includes vertical interconnects, such as conventional vias or contacts, and horizontal interconnects, such as metal lines. The various interconnection features may implement various conductive materials including copper, tungsten, and/or silicide.

Additional steps can be provided before, during, and after the method 100, and some of the steps described can be replaced, eliminated, or moved around for additional embodiments of the method 100.

Based on the above, the present disclosure offers a TFET device with a frustoconical protrusion structure (a core structure) and methods of fabrication. With the frustoconical protrusion structure, a vertical TFET device is provided and its fabrication employs quite simple processes.

The present disclosure provides many different embodiments of TFET device that provide one or more improvements over other existing approaches. In one embodiment, the TFET device includes a substrate, a frustoconical protrusion structure with a first width disposed over the substrate and protruding out of the plane of substrate, a drain region with a second width disposed over the substrate adjacent to the frustoconical protrusion structure and extending to a bottom portion of the frustoconical protrusion structure as a raised drain region, a gate stack with a third width disposed over the substrate. The gate stack has a planar portion, which is parallel to the surface of substrate and a gating surface, which wraps around a middle portion of the frustoconical protrusion structure, including overlapping with the raised drain region. The TFET device also includes an isolation dielectric layer disposed between the planar portion of the gate stack and the drain region and a source region with the first width disposed as a top portion of the frustoconical protrusion structure, including overlapping with a top portion of the gating surface of the gate stack.

In another embodiment, a vertical TFET device includes a semiconductor substrate, a frustoconical protrusion cylinder with a first width disposed over the substrate and protruding out of the plane of semiconductor substrate, a source region as a top portion of the frustoconical protrusion cylinder, a high-k/metal gate (HK/MG) with a second width disposed over the semiconductor substrate. The HK/MG has a planar portion, which is parallel to the surface of semiconductor substrate and a gating surface, which wraps around a middle portion of the frustoconical protrusion cylinder, including overlapping with the source region, a drain region with a third width disposed over the semiconductor substrate adjacent to the frustoconical protrusion cylinder and extending to a bottom portion of the frustoconical protrusion cylinder as a raised drain region, an isolation dielectric layer disposed between the planar portion of the HK/MG and the drain region and an isolation feature disposed between the drain regions.

In yet another embodiment, a method of fabricating a semiconductor device includes providing a substrate, etching the substrate to form a protrusion on a surface of the substrate, doping a portion of the substrate adjacent to the protrusion to form a drain region, including extending to a lower portion of the protrusion to form a raised drain region, forming a first isolation dielectric layer over the drain region, forming gate stack with a planar portion over the drain region, which is parallel to the surface of substrate, and a gating surface, which wraps around a middle portion of the protrusion, including overlapping with the raised drain region, forming a second isolation dielectric layer over the planar portion of the gate stack and the drain region, recessing a portion of the gating surface of the gate stack to expose a top portion of the protrusion and forming a source region on the top portion of the protrusion, including overlapping with the gating surface of the gate stack. The source region is formed with a different dope type than the drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, source and drain regions are often swapped with an appropriate process modification/interchanging, depending on the transistor's eventual use and electrical configuration. Therefore, the terms "source" and "drain" are deemed to be interchangeable under such circumstances. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    removing a portion of a substrate to form a protrusion feature, wherein the protrusion feature is formed of semiconductor material having opposing sidewalls;
    forming a drain feature in the protrusion feature via a first implantation process, wherein at least a portion of the opposing sidewalls of the protrusion feature are exposed during the forming of the drain feature in the protrusion feature via the first implantation process, the drain feature formed of the semiconductor material and having a first doping type polarity;
    forming a gate dielectric layer along sidewalls of the drain feature and sidewalls of the protrusion feature;
    forming a gate electrode layer over the gate dielectric layer along the sidewalls of the drain feature and the sidewalls of the protrusion feature; and
    forming a source feature in the protrusion feature, the source feature formed of the semiconductor material and having a second doping type polarity that is opposite the first doping type polarity, wherein the source feature is separated from the drain feature by a portion of the protrusion feature formed of the semiconductor material that extends from the source feature to the drain feature.

2. The method of claim 1, wherein the substrate is formed of the semiconductor material.

3. The method of claim 1, wherein removing the portion of the substrate to form the protrusion feature includes:
    forming a patterned hard mask layer over the substrate; and
    etching the substrate by using the patterned hard mask layer as an etching mask.

4. The method of claim 1, wherein the drain feature extends into the substrate below the protrusion feature.

5. The method of claim 1, further comprising:
    forming a first dielectric material layer directly on the sidewalls of the drain feature;
    forming a second dielectric material layer directly on the gate electrode layer; and
    forming a third dielectric material layer directly on the source feature.

6. The method of claim 1, further comprising removing a portion of the gate electrode layer and a portion of the gate dielectric layer to expose the protrusion feature, and
    wherein forming the source feature in the protrusion feature includes forming the source feature in the exposed protrusion feature.

7. The method of claim 6, wherein forming the source feature in the exposed protrusion feature includes performing a second implantation process.

8. The method of claim 1, further comprising forming a dielectric isolation feature in the substrate adjacent the protrusion feature prior to forming the drain feature.

9. The method of claim 8, further comprising forming a dielectric layer directly on the dielectric isolation feature.

10. The method of claim 1, wherein after forming the source feature, the gate dielectric layer extends along sidewalls of the source feature.

11. A method comprising:
    forming a first source/drain feature in a semiconductor feature protruding from a substrate via a first implantation process, wherein at least a portion of opposing sidewalls of the semiconductor feature are exposed during the forming of the first source/drain feature in the semiconductor feature via the first implantation process, the first source/drain feature formed of a semiconductor material and having a first doping type polarity;
    forming a gate dielectric layer along sidewalls of the first source/drain feature;
    forming a gate electrode layer over the gate dielectric layer along the sidewalls of the first source/drain feature; and
    forming a second source/drain feature in the semiconductor feature, the second source/drain feature formed of the semiconductor material and having a second doping type polarity that is opposite the first doping type polarity, wherein the second source/drain feature is separated from the first source/drain feature by a portion of the semiconductor feature formed of the semiconductor material that extends from the second source/drain feature to the first source/drain feature.

12. The method of claim 11, further comprising:
    forming a patterned hard mask layer over the substrate; and
    etching the substrate to form the semiconductor feature protruding thereover.

13. The method of claim 11, wherein forming the gate dielectric layer along sidewalls of the first source/drain feature includes forming the gate dielectric layer over a top surface of the semiconductor feature that faces away from the substrate, and
    wherein forming the gate electrode layer over the gate dielectric layer along the sidewalls of the first source/drain feature includes forming the gate electrode layer over the top surface of the semiconductor feature, and
    wherein forming the second source/drain feature in the semiconductor feature includes:
        removing a portion of the gate dielectric layer and a portion of the gate electrode layer over the top surface of the semiconductor feature; and
        performing a second implantation process on the top surface of the semiconductor feature.

14. The method of claim 11, wherein the semiconductor feature has a frustoconical shape.

15. The method of claim 11, further comprising forming a dielectric layer directly on the second source/drain feature.

16. The method of claim 11, wherein after forming the second source/drain feature, the gate dielectric layer physically contacts the first source/drain feature, the portion of the semiconductor feature, and the second source/drain feature.

17. The method of claim 11, further comprising forming a dielectric isolation feature in the substrate adjacent the semiconductor feature prior to forming the first source/drain feature, and
    wherein the first source/drain feature extends within the substrate to the dielectric isolation feature.

18. The method of claim 11, further comprising:
    forming a first dielectric material layer directly on the sidewalls of the first source/drain feature;
    forming a second dielectric material layer directly on the gate electrode layer; and
    forming a third dielectric material layer directly on the second source/drain feature.

19. A method for forming a field effect transistor (FET), the method comprising:
    providing a substrate, the substrate formed of a semiconductor material;

etching the substrate to form a protrusion on a surface of the substrate, wherein the protrusion is formed of the semiconductor material and has opposing sidewalls;

forming a trench in the substrate, the trench having opposing sidewalls and a bottom surface defined by the semiconductor material of the substrate;

after etching the substrate to form the protrusion, forming a shallow trench isolation structure in the trench such that the shallow trench isolation structure physically contacts the opposing sidewalls and the bottom surface of the trench defined by the semiconductor material of the substrate;

doping, via an implantation process, a portion of the substrate adjacent to the protrusion to form a drain region and a lower portion of the protrusion to form a raised drain region, wherein at least a portion of the opposing sidewalls of the protrusion are exposed during the doping of the lower portion of the protrusion to form the raised drain region via the implantation process;

forming a first isolation dielectric layer over the drain region;

forming gate stack having a planar portion over the drain region, which is parallel to the surface of substrate, and a gating surface, which wraps around a middle portion of the protrusion, including overlapping with the raised drain region;

forming a second isolation dielectric layer over the planar portion of the gate stack and the drain region;

recessing a portion of the gating surface of the gate stack to expose a top portion of the protrusion; and forming a source region on the top portion of the protrusion with a different dope type than the drain region, including overlapping with the gating surface of the gate stack.

20. The method of claim 19, wherein a sidewall of the protrusion is formed to have an angle with the planar surface of the substrate ranging from about 45 degrees to about 90 degrees.

* * * * *